United States Patent

Kakizaki et al.

Patent Number: 6,007,925
Date of Patent: Dec. 28, 1999

[54] ELECTRONIC APPARATUS CASING AND ELECTRONIC APPARATUS CASING PRODUCTION METHOD

[75] Inventors: Masahiko Kakizaki, Tokyo; Takahiro Shimouchi, Fukui, both of Japan

[73] Assignee: Sony Corporation, Tokyo, Japan

[21] Appl. No.: 09/097,749

[22] Filed: Jun. 16, 1998

Related U.S. Application Data

[62] Division of application No. 08/974,963, Nov. 20, 1997.

[30] Foreign Application Priority Data

Nov. 25, 1996 [JP] Japan ................................ 8-313992

[51] Int. Cl.$^6$ ........................... B21D 39/00; C03C 27/02; B32B 15/00
[52] U.S. Cl. .......................... 428/623; 428/630; 428/632; 428/649; 428/675; 428/428; 428/433
[58] Field of Search .................................... 428/623, 630, 428/632, 649, 675, 428, 433; 427/438

[56] References Cited

U.S. PATENT DOCUMENTS

| | | | |
|---|---|---|---|
| 4,371,573 | 2/1983 | Januschkowetz et al. | 427/438 |
| 5,091,224 | 2/1992 | Kushida et al. | 427/419.4 |
| 5,672,433 | 9/1997 | Cook | 428/469 |

*Primary Examiner*—Paul Thibodeau
*Assistant Examiner*—Holly C. Rickman
*Attorney, Agent, or Firm*—Hill & Simpson

[57] ABSTRACT

An electronic apparatus casing that includes a casing body made from a magnesium or magnesium alloy material is provided. The external surface of this casing body is protected by a plurality of film layers. Specifically, a first layer of copper is formed on the casing body. Then, a second layer of nickel is formed on the first layer of copper. A third layer of a transparent glass is then formed on the second layer of nickel. Lastly, a fourth layer of silica is formed on the third layer of transparent glass. The combination of these layers functions to exhibit a corrosion resistance, an abrasion resistance as well as an external metallic feeling.

5 Claims, 2 Drawing Sheets

ELECTRONIC APPARATUS CASING AND ELECTRONIC APPARATUS CASING PRODUCTION METHOD

This application is a division of U.S. application Ser. No. 08/974,963, filed Nov. 20, 1997 pending.

BACKGROUND OF THE INVENTION

1. Field of the Invention

The present invention relates to a case for an electronic device an a production method of the case, and particularly to an electronic device case made by using magnesium or a magnesium alloy and a production method thereof.

2. Description of the Prior Art

A metal material or an alloy material having an excellent mechanical characteristic and showing an excellent touch feeling is widely used for an external casing material in various fields. Especially, a magnesium alloy material is the lightest material among practical materials, showing an excellent cutting property, a high strength/density ratio as well as an excellent die casting property, and its application for a casing has been examined in various fields such as computers, audio apparatuses, communication apparatuses, electronic apparatuses, and the like.

However, the magnesium alloy has an inferior resistance for corrosion and is easily oxidized in the atmosphere, forming a thin film on the surface, which deteriorates the external view. Especially when subjected to a precision cutting, corrosion resistance becomes a big problem.

For this, in order to improve the corrosion resistance and abrasion resistance of the magnesium alloy material, conventionally, anodizing and chemical conversion treatment has been carried out by using a heavy metal salt such as chromate (VI), manganate, permanganate or the like, and fluoride.

However, there arises a problem that the metal feeling is deteriorated where the anodizing or the chemical conversion treatment is carried out.

Use of heavy metal salts in anodizing or the chemical conversion treatment also brings about a problem of contamination of the environment.

There is also a finishing method of a magnesium alloy material by carrying out a shot blast to obtain a rough surface and then painting the rough surface. In this case, the metal feeling is completely lost.

As has been described above, use of a magnesium alloy material for a casing of an electronic apparatus has not been implemented in practice because of the aforementioned problems.

SUMMARY OF THE INVENTION

It is therefore an object of the present invention to provide an electronic apparatus casing which resolves the above-mentioned problem.

It is another object of the present invention to provide a production method of an electronic apparatus casing which resolves the above-mentioned problem.

According to the present invention, there is provided a casing for an electronic apparatus. The electronic apparatus casing includes a casing body made from a magnesium or magnesium alloy material. A plurality of layers is then formed on the casing body. Specifically, a first layer of copper is formed on the casing body. A second layer of nickel is formed on the first layer of copper. A third layer of a transparent glass is formed on the second layer of nickel. Lastly, the electronic apparatus casing includes a fourth layer of silica formed on the third layer of transparent glass.

DETAILED DESCRIPTION OF THE PREFERRED EMBODIMENTS

Description will now be directed to an electronic apparatus casing and a production method thereof according to the present invention with reference to the attached drawings.

Figure 1:
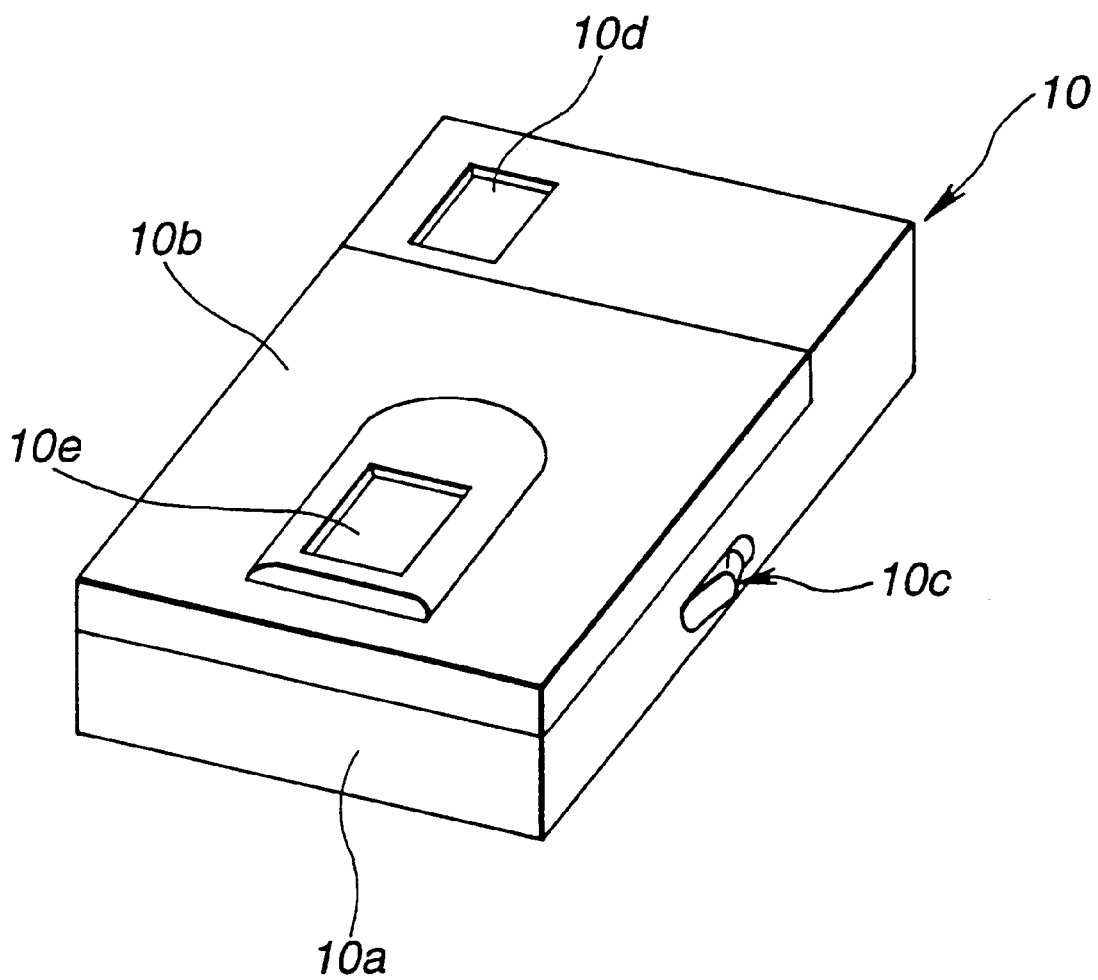
FIG. 1 is a perspective external view of a disk player as an electronic apparatus according to an embodiment of the present invention.

The electronic apparatus casing according to the invention is, for example, a casing 10 for a disk player for reproducing an optical disk having a diameter of about 64 $\mu$m contained in a disk cartridge. As shown in FIG. 1, the casing 10 includes a body 10a, a cover 10b, a lock release section 10c for releasing a locked state of the cover 10b, a display section 10d, and a window 10e. The body 10a is made from a magnesium or a magnesium alloy material shaped by a press working or the like into approximately a rectangular parallelepiped. In the same way as the body 10a, the cover 10b is made from a magnesium or a magnesium alloy material shaped by a press working, and is rotatably attached to the body 10a. The cover 10a is provided at a position to cover and open a disk reproduction section (not depicted) contained in the body 10a. A rear surface of the cover 10b facing the body 10a has a holder for the aforementioned disk cartridge and mounting the optical disk on the disk reproduction section. A user inserts the disk cartridge into the holder and rotates the cover 10b to a closed position so as to cover the body 10a as shown in FIG. 1, when the optical disk in the cartridge is mounted on the disk reproduction section.

The body 10a is provided with a lock mechanism (not depicted) for locking the cover 10b at the closed position and the lock release section 10c for releasing the locked state of the cover 10b. The locked state is released when the lock release section 10c is operated to be shifted in place. Then, the cover 10b can be opened upwardly above the disk reproduction section in the body 10a.

The display section 10d is, for example, a liquid crystal display element provided on one of the faces of the body 10a. The display section 10d shows various information such as a title information read from the optical disk by the disk reproduction section as well as a reproduction time of the disk which has elapsed.

The window 10e is formed in the cover 10b. Through this window, it is possible to check from outside whether a disk cartridge is mounted on the disk player 10. The window 10e is covered by a plate-shaped member made from a transparent synthetic resin, preventing intrusion of dusts through the window into the interior of the disk player.

Figure 2:
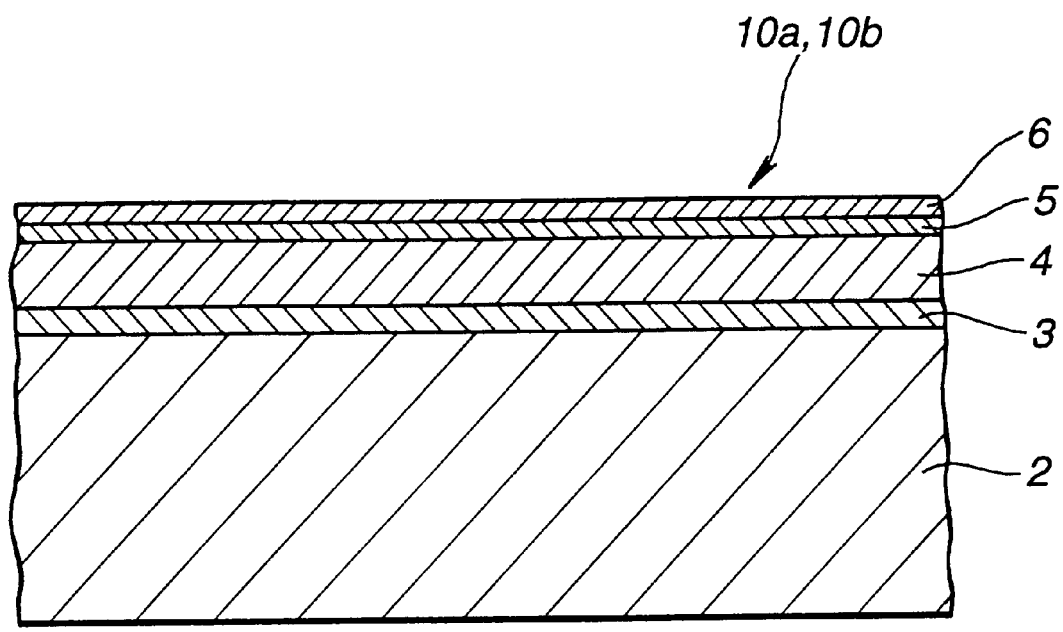
FIG. 2 is a cross sectional view schematically showing a layer configuration of a surface of a body and a cover.

As shown in FIG. 2, the body 10a and the cover 10b of the disk player 10 according to the present embodiment mainly consists of a plate-shaped magnesium or magnesium alloy which is shaped by a press working or the like into a predetermined shaped body 2.

The external surface of the shaped body 2 is protected by a plurality of film layers: a copper layer 3, a nickel layer 4, a hard transparent glass protection layer 5, a silica layer 6 which are successively formed in this order.

Among these layers, the copper layer 3 is formed in a thickness of about 2 μm as a bedding which serves to improve adhesion of the layers formed on this layer as well as to mitigate a stress.

On this copper layer 3 is formed the nickel layer 4 in a thickness of about 30 μm which serves to assure an external metallic feeling.

Note that it is possible that this nickel layer 4 is covered by a plating of Cr or Pd according to a necessary external view.

The aforementioned hard transparent glass protection layer 5 is formed by coating a colloid liquid mixture containing $SiO_2$ and $Na_2O$, which is heated to be calcinated into a thickness of about 1 to 5 μm.

The silica layer 6 is formed by coating a partially hydrolyzed solution prepared by partially hydrolyzing organic silicate alkyl esters, which is then heated and dried to be calcinated into a $SiO_2$ film having a thickness of about 1 to 3 μm.

This silica layer 6 itself does not have a remarkable hardness and cannot exhibit a sufficient abrasion resistance, but in combination with aforementioned hard transparent glass protection layer 5, it is possible to form a surface having an excellent abrasion resistance, i.e., a surface which cannot be scratched easily.

The body 10a and the cover 10b are very light in weight because they mainly consist of a magnesium or a magnesium alloy material. Moreover, the combination of the layers functions to exhibit an excellent corrosion resistance and an excellent abrasion resistance as well as an excellent external metallic feeling.

Description will now be directed to the body 10a and the cover 10b of the disk player casing 10.

In order to produce the aforementioned body 10a and the cover 10b, it is necessary firstly to shape a plate made from a magnesium or magnesium alloy material into a predetermined casing configuration by way of a mechanical processing such as a press working.

The shaped body obtained is then subjected to a surface grinding and barrel polishing so as to make the surface roughness equal to or below 1 S. For this, it is also possible to employ buffing, but buffing may leave a trace on the polished surface. So it is preferable to employ buffing as an auxiliary processing when the surface is too rough. For the barrel polishing, for example, it is possible to use walnut chips onto which a grinding agent is adhered.

Subsequently, a blasting is carried out onto the surface of the shaped body so as to make rough the surface uniformly to an appropriate extent. This blasting is required for assuring adhesion of the layers to be formed on this surface.

After carrying out the aforementioned surface processing to the surface of the shaped body, copper (Cu) is non-electolytically plated to form the copper layer 3. This copper layer 3 is formed to have a thickness of about 2 μm and serves to improve the adhesiveness and mitigate the stress.

Next, on this copper layer 3 is formed the nickel layer 4 by way of non-electrolytic plating method. It is also considered to employ the electrolytic plating, but this brings about a non-lusted state. Consequently, it is preferable to employ a non-electrolytic plating method. The nickel layer 4 is formed to have a thickness of about 30 μm.

According to a demand for the external view, it is also possible to plate the nickel layer 4 with chrome (Cr) or palladium (Pd).

After forming the copper layer 3 and the nickel layer 4, the nickel layer 4 is subjected to the surface grinding using a grindstone and the barrel polishing. The surface roughness at this time is set to 0.5 S or below at the final stage. In this embodiment, the surface roughness was set to 0.2 S.

Next, fine ceramic balls or glass beads are blown. A so-called honing processing is carried out so as to frost the nickel layer 4.

This honing can be carried out, for example, by blowing alumina balls with a pressure of about 1.3 to 1.8 kg/cm². In this embodiment, alumina balls of #180 were blown with a pressure of 1.5 kg/cm².

After these surface processing steps are complete, the hard transparent glass protection layer 5 and the silica layer 6 are formed to prevent stain or scratch.

The hard transparent glass protection layer 5 is formed by applying a colloid solution of a mixture of sodium silicate and silica sol (containing 20 to 21 weight % of $SiO_2$ and 3.8 to 4.4 weight % of $Na_2O$). Here, the colloid solution is not used as it is. In this embodiment, the colloid solution was diluted by 4 to 8 times by using a pure water from which carbon dioxide is removed substantially completely, so as to obtain a diluted colloid solution containing about 2.5 to 5.0 weight % of $SiO_2$  and about 0.5 to 1.0 weight % of $Na_2O$.

This diluted colloid solution is applied by way of spray blowing and is heated, for example, at 150 to 300° C. for 30 to 120 minutes so as to be calcinated into a thin glass film having thickness of about 1 to 5 μm.

Lastly, on this hard transparent glass protection layer 5 is formed the silica layer 6 to complete the body 10a and the cover 10b. This silica layer 6 is formed by applying a partially hydrolyzed solution of an alkyl silicate, which is then heated to be calcinated into a thin film of about 1 to 3 μm.

The partially hydrolyzed solution of alkyl silicate can be prepared by way of partial hydrolysis of an organic silicate alkyl ester which is represented as follows:

$$R'_n Si(OR)_{4-n}$$

(wherein, R represents a low class alkyl group, and R' represents a methyl group or phenyl group.) The organic silicate alkyl ester is preferably an ethyl silicate. It is preferable that this partially hydrolyzed solution have a concentration of about 20 to 40 weight %.

This partially hydrolyzed solution is applied by an ordinary application method such as spray blowing and, for example, is heated at a temperature from 150 to 300° C. for 30 to 120 minutes so as to be calcinated into an $SiO_2$ film as the silica layer 6.

The present invention has been described in a case of a disk player casing. The present invention is not limited to the disk player but also can be applied to casing of various electronic apparatuses such as a portable audio apparatus, stand-alone type acoustic apparatus, a video apparatus, an audio-visual apparatus for use in an automobile as well as interior parts of an automobile.

As has thus far been described, according to the present invention, there can be provided an electronic apparatus casing which is light in weight and exhibits an excellent corrosion resistance and abrasion resistance as well as an excellent external metallic appearance.

What is claimed is:

1. An electronic apparatus casing comprising:
   a casing body with a roughened surface, said casing body made from a magnesium or magnesium alloy material;
   a first layer of copper formed on said casing body, said first layer having a thickness of about 2 μm;

a second layer of nickel formed on said first layer, said second layer hiving a thickness of about 30 μm;

a third layer of a transparent glass formed on said second layer; and a fourth layer of silica formed on said third layer.

2. An electronic apparatus casing as claimed in claim 1, wherein the silica forming said fourth layer is derived from an organic silicate alkyl ester.

3. An electronic apparatus casing as claimed in claim 1, wherein said fourth layer of silica is formed by applying a partially hydrolyzed organic silicate alkyl ester, which is then heated so as to be calcinated.

4. An electronic apparatus casing as claimed in claim 1, wherein said third layer has a thickness ranging from about 1 μm to 5 μm.

5. An electronic apparatus casing as claimed in claim 1, wherein the fourth layer of silica has a thickness ranging from about 1 μm to 3 μm.

\* \* \* \* \*